United States Patent
Nayfeh et al.

(10) Patent No.: US 8,076,410 B2
(45) Date of Patent: Dec. 13, 2011

(54) LUMINESCENT SILICON NANOPARTICLE-POLYMER COMPOSITES, COMPOSITE WAVELENGTH CONVERTER AND WHITE LED

(75) Inventors: Munir H. Nayfeh, Urbana, IL (US); Salman A. H. Alrokayan, Riyadh (SA)

(73) Assignee: Nanosi Advanced Technologies, Inc., Champaign, IL (US)

( * ) Notice: Subject to any disclaimer, the term of this patent is extended or adjusted under 35 U.S.C. 154(b) by 156 days.

(21) Appl. No.: 12/241,870

(22) Filed: Sep. 30, 2008

(65) Prior Publication Data
US 2009/0102353 A1    Apr. 23, 2009

Related U.S. Application Data

(60) Provisional application No. 60/997,718, filed on Oct. 4, 2007.

(51) Int. Cl.
*C08F 292/00* (2006.01)
*C09K 11/59* (2006.01)
*H01J 1/63* (2006.01)

(52) U.S. Cl. . 524/789; 524/442; 524/492; 257/E51.024; 257/E51.027; 313/498; 252/301.36

(58) Field of Classification Search .......... 313/501, 313/502, 498; 252/301.36; 438/70; 257/E51.046, 257/E51.024, E51.027; 524/492, 493, 730, 524/789, 871, 442
See application file for complete search history.

(56) References Cited

U.S. PATENT DOCUMENTS

| | | | | |
|---|---|---|---|---|
| 6,049,090 A * | 4/2000 | Clark, Jr. | | 257/13 |
| 7,001,578 B2 * | 2/2006 | Nayfeh et al. | | 423/348 |
| 7,045,956 B2 * | 5/2006 | Braune et al. | | 313/512 |
| 2004/0126582 A1 * | 7/2004 | Ng et al. | | 428/403 |
| 2004/0245912 A1 * | 12/2004 | Thurk et al. | | 313/484 |

OTHER PUBLICATIONS

Que et al. Journal of Electronic Materials, 2001, 30, 6-10.*
Li et al. Nano Letters 2004, 4(8), 1463-1467.*
Li et al. Langmuir 2004, 20, 1963-1971.*
Zhang et al. Nanotechnology 2007, 18, 095601 (6pp).*
Zou et al. Nano Letters 2004, 4(7), 1181-1186.*

(Continued)

*Primary Examiner* — David W Wu
*Assistant Examiner* — Vu A Nguyen
(74) *Attorney, Agent, or Firm* — Greer, Burns & Crain Ltd.

(57) ABSTRACT

An embodiment of the invention is luminescent silicon nanoparticle polymer composite that can serve as a wavelength converter or a UV absorber. The composite includes a polymer or an organosilicon compound; and within the polymer or organosilicon compound, a dispersion of luminescent silicon nanoparticles. In a preferred composite, the silicon nanoparticles have multiple Si—H termination sites, the silicon nanoparticles being linked to a C site to produce a silicon carbide bond (Si—C). In a preferred embodiment, the polymer comprises polyurethane. A composite of the invention can perform wavelength conversion. In a wavelength converted film of the invention, the silicon nanoparticles are incorporated into the polymer or organosilicon compound in a quantity sufficient for wavelength conversion but small enough to have no or an insubstantial effect on the properties of the polymer or the organosilicon compound. A white LED of the invention includes a light emitting diode having a narrow band wavelength output. A luminescent silicon wavelength converter includes a composite film as described above for converting the narrow band wavelength output into wide band wavelength output. In a preferred embodiment, the LED comprises a GaN LED, and the wavelength converter film is disposed on an active region of the LED.

8 Claims, 4 Drawing Sheets

OTHER PUBLICATIONS

Ando et al. Journal of Non-Crystalline Solids 2002, 299-302, 1084-1089.*
Zhang et al. Nanotechnology 2007, 18, 095601, 6 pages.*
National LED Direct, led 101 LED or Solid State Lighting, 2008.

Michael Bowers, Sandra Rosenthal, and James McBride, "White-light Emission from Magic-Sized Cadmium Selenide Nanocrystals", *Journal of the American Chemical Society*, Oct. 18, 2005.

* cited by examiner

LUMINESCENT SILICON NANOPARTICLE-POLYMER COMPOSITES, COMPOSITE WAVELENGTH CONVERTER AND WHITE LED

PRIORITY CLAIM AND REFERENCE TO RELATED APPLICATION

This application claims priority under 35 U.S.C. §119 from prior provisional application Ser. No. 60/997,718, which was filed Oct. 4, 2007.

FIELD

A field of the invention is polymer composites. Another field concerns light emitting diodes.

BACKGROUND

For the past 150 years, lighting technology has been primarily limited to incandescent and fluorescent tube light sources. These sources were typically the only ones that produced sufficient illumination in an acceptable spectrum. However, both incandescent and fluorescent bulbs are relatively inefficient in converting electrical energy into light. While derivative technologies such as high-intensity discharge lamps (HID) have emerged, none have achieved energy efficiencies exceeding 25%, with incandescent lighting achieving an efficiency of less than 2%.

Incandescent and fluorescent bulbs are also fragile and relatively not compact. The fragility results from the requirement of creating a significantly less than atmospheric pressure environment inside the bulbs. The volume of the bulbs makes them non compact. Fluorescent bulbs also generally require ballast to ignite, raising the cost of the bulbs.

One alternative being investigated to replace the traditional incandescent and fluorescent lighting sources is known as Solid State Lighting (SSL). Solid state lighting based upon solid state electronic devices, such as light-emitting diodes (LEDs), organic light-emitting diodes (OLED), or polymer light-emitting diodes, as sources of illumination rather than electrical filaments or gas.

Light emitting diodes are in widespread use, but not as general lighting sources. Commercial LEDs debuted in the 1960s. Initial LEDs were red in color, with yellow and orange variants following soon thereafter. White light may be created by combining the light of separate LEDs (red, green, and blue), or by creating white LEDs through doping.

Unlike traditional lighting solid state lighting creates visible light with virtually no heat or parasitic energy dissipation. Solid-state light sources are also much more durable, proving greater resistance to shock, vibration, and wear, and possess impressive operational lifespan significantly. A significant limitation of solid state lighting, including LEDs, is their inability to produce broad spectrum light, namely white light. White light is desirable for general lighting purposes as human eyesight finds white light to be comfortable.

Efforts have been made to produce white lights from LEDs. One technique is known as color mixing. Color mixing involves utilizing multiple LEDs in a lamp and varying the intensity of each LED to produce white light. The lamp contains a minimum of two LEDs (blue and yellow), but can also have three (red, blue, and green) or four (red, blue, green, and yellow). In the color-mixing method, degradation of different LEDs at various times can lead to an uneven color output. For white light to be produced that spans the visible spectrum (red, green, and blue), LEDs must produce the component narrow band emissions in the correct proportions.

Wavelength conversion is the other general technique. It is preferable to color mixing, as wavelength conversion results in a true white emitting LED. Wavelength conversion involves converting some or all of the LED's output into visible wavelengths. Wavelength conversion methods used to accomplish this feat include:

1) Blue LED & yellow phosphor—This is considered the least expensive method for producing white light. Blue light from an LED is used to excite a phosphor which then re-emits yellow light. This balanced mixing of yellow and blue lights results in the appearance of white light.

2) Direct Bandgap Materials A certain size distribution (around~3.7 nm) of InP nanoparticles, a direct bandgap material, which produce sharper lines of luminescence for a certain particle size, has been proposed for incorporation in phosphorous LEDs to alleviate the red problem. Testing or implementation has not been achieved yet.

3) Blue LED & several phosphor—This is similar to the process involved with yellow phosphors, except that each excited phosphor re-emits a different color. Similarly, the resulting light is combined with the originating blue light to create white light. The resulting light, however, has a richer and broader wavelength spectrum and produces a higher color-quality light, albeit at an increased cost.

4) Ultraviolet (UV) LED & doped phosphors (red, green, & blue)—The UV light from a UV LED is used to excite different phosphors, which are doped at measured amounts. The colors are mixed resulting in a white light with the richest and broadest wavelength spectrum.

5) Blue LED & quantum dots—A process by which a thin layer of nanocrystal particles containing 33 or 34 pairs of atoms, primarily cadmium and selenium, are coated on top of an LED. The blue light excites the quantum dots, resulting in a white light with a wavelength spectrum similar to UV LEDs. This method is unlikely to prove successful for several reasons. First, the production of the nanomaterial is very expensive, for example being nearly 200 fold more than organic pigments or Si nanoparticles. Also, the cadmium and selenium nanocrystal particles are not available in a uniform size distribution, making it difficult to control color mixing.

Both of the color mixing and known wavelength conversion techniques face significant limitations that are barriers to widespread adoption as lighting sources. The current manufacturing processes for the wavelength conversion techniques above are immature and not cost-effective. There are also problems with the phosphor conversion model. These techniques do not emit broad enough wavelength spectrum of light, as they lack a red component. They also have absorption and emission that can't be tuned, and possess inflexibility of form resulting from the need for the phosphor to be placed in the emission path of the LEDs and have the phosphor to have its emission directed in a desired direction. Phosphor films are also known to have appreciable reflectivity, which causes a non-negligible fraction of the LED light to be reflected back toward the LEDs, causing heating effects that can make driving the LED more difficult and can create other difficulties, necessitating more complex and rigorous heat dissipation designs. Also, since phosphors respond more strongly to the blue portion of the LED light, the transmitted UV portion can be hazardous to human vision. With systems operating at high intensity, efforts should be made to incorporate UV blockers. The same problems can be said about organic pigments.

One recent concept that employed UV blockers for safety purposes involves $TiO_2$ nanoparticles added to the active layer to attenuate the UV, while automotive grade heat resistant organic pigments were used to down convert the blue light. The use of $TiO_2$ is necessitated by the fact that the pigments are not sensitive to UV.

SUMMARY OF THE INVENTION

An embodiment of the invention is luminescent silicon nanoparticle polymer composite that can serve as a wavelength converter or a UV absorber. The composite includes a polymer or an organosilicon compound; and within, the polymer or organosilicon compound, a dispersion of luminescent silicon nanoparticles. In a preferred composite, the silicon nanoparticles have multiple Si—H termination sites, the silicon nanoparticles being linked to a C site to produce a silicon carbide bond (Si—C). In a preferred embodiment, the polymer comprises polyurethane.

A composite of the invention can perform wavelength conversion. In a wavelength converted film of the invention, the silicon nanoparticles are incorporated into the polymer or organosilicon compound in a quantity sufficient for wavelength conversion but small enough to have no or an insubstantial effect on the properties of the polymer or the organosilicon compound.

A white LED of the invention includes a light emitting diode having a narrow band wavelength output. A luminescent silicon wavelength converter includes a composite film as described above for converting the narrow band wavelength output into wide band wavelength output. In a preferred embodiment, the LED comprises a GaN LED, and the wavelength converter film is disposed on an active region of the LED.

DETAILED DESCRIPTION OF THE PREFERRED EMBODIMENTS

The invention provides white luminescent silicon nanoparticle/polymer composite films that provide wavelength conversion and UV filtering in addition to anti-reflection. The invention also provides a white LED that includes a UV or blue LED and luminescent silicon nanoparticle composite converter and UV filter film.

An embodiment of the invention is a silicon nanoparticle-based white LED that includes an ultraviolet (UV)/Blue LED and n RGB converter realized by a luminescent silicon nanoparticle composite having silicon nanoparticles that respond to stimulation by producing wide spectrum white light emissions. The luminescent silicon nanoparticles can be embedded in layers of organosilicon or polymer adhesives. The predetermined selected sizes of the silicon nanoparticle permit selection of their color, namely red, orange, green, & blue. In a preferred embodiment white LED device of the invention, a thin multilayer layer of polymer-silicon nanoparticle composite is provided over a UV/blue LED, either as part of the LED chip, or a lens, or housing, and converts the emission output into pleasing white light output.

The invention also provides a wavelength converter that can be used with other devices. The wavelength converter silicon nanoparticles can be embedded in layers of organosilicon or polymer adhesives. The predetermined selected sizes of the silicon nanoparticle permit selection of their color, namely red, orange, green, & blue.

Several advantages can be realized with the use of preferred embodiment nanosilicon-polymer wavelength converters and with white LEDs of the invention. The silicon nanoparticles are efficient UV blockers since they are highly absorbent of the UV wavelengths. The nanoparticles perform dual function of wavelength conversion and UV filtering, resulting in a safe white light source. The nanoparticle converters in preferred embodiments produce an efficient emission source. The nanoparticles are excellent down converters to visible light. In addition to being highly absorbent of the UV, they emit visible light with a quantum conversion larger than 50%. The high efficiency conversion also limits adverse temperature rise, which extends working lifetime and/or removes the need for cooling structures. The nanoparticles are also highly photostable under UV excitation, providing a long safe working lifetime. In addition, the nanoparticle conversion/filter film acts as excellent antireflection coating, which prevents light from going back into the LED housing.

Luminescent silicon nanoparticles are available in a plurality of discrete sizes that produce different wavelengths of luminescent output, and can be combined to cover the entire visible spectrum. The invention provides silicon nanoparticle broad spectrum converter/UV filter films that have high optical quality and uniform distributions. The high optical quality and uniform distributions are important because the emission, transmission and losses of wavelength converters strongly depends on thickness uniformity and composition of the converter. White LEDs of the invention use silicon nanoparticle/polymer films that have insubstantial agglomeration. Many different polymers blend homogeneously with silicon nanoparticles without aggregation and agglomeration.

Silicon nanoparticles used in embodiments of the invention can be obtained by various processes known in the art. Example methods for producing nanoparticles used in embodiments of the invention are disclosed in U.S. Pat. No. 7,001,578, entitled "Family of discretely sized silicon nanoparticles and method for producing the same"; and in U.S. Pat. No. 6,846,474, entitled "Silicon nanoparticle and method for producing the same," Silicon nanoparticles obtained by other methods can also be used in embodiments of the invention so long as the methods can provide a colloid of nanoparticles of uniform dimension that can blend homogenously with polymers without substantial agglomeration.

An embodiment of the invention is luminescent silicon nanoparticle polymer composite that can serve as a wavelength converter or a UV absorber. The composite includes a polymer or an organosilicon compound; and within, the polymer or organosilicon compound, a dispersion of luminescent silicon nanoparticles. In a preferred composite, the silicon nanoparticles have multiple Si—H termination sites, the silicon nanoparticles being linked to a C site to produce a silicon carbide bond (Si—C). In a preferred embodiment, the polymer comprises polyurethane.

Surprisingly, the Si—H terminated silicon nanoparticles do not aggregate when mixed with polymers or organosilicon components. This was a surprising result, as the addition of particles to polymers and organosilicon compounds is typically expected to inhibit the properties of the compounds and result in the aggregation of particles.

A composite of the invention can perform wavelength conversion. In a wavelength converted film of the invention, the silicon nanoparticles are incorporated into the polymer or organosilicon compound in a quantity sufficient for wavelength conversion but small enough to have no or an insubstantial effect on the properties of the polymer or the organosilicon compound.

A white LED of the invention includes a light emitting diode having a narrow band wavelength output. A luminescent silicon wavelength converter includes a composite film as described above for converting the narrow band wavelength output into wide band wavelength output. In a preferred embodiment, the LED comprises a GaN LED, and the wavelength converter film is disposed on an active region of the LED.

Experiments and particular example coatings and paints will now be discussed. The experiments have demonstrated example embodiment coatings and paints, while artisans will appreciate broader aspects of the invention from the experimental embodiments.

Figure 1:
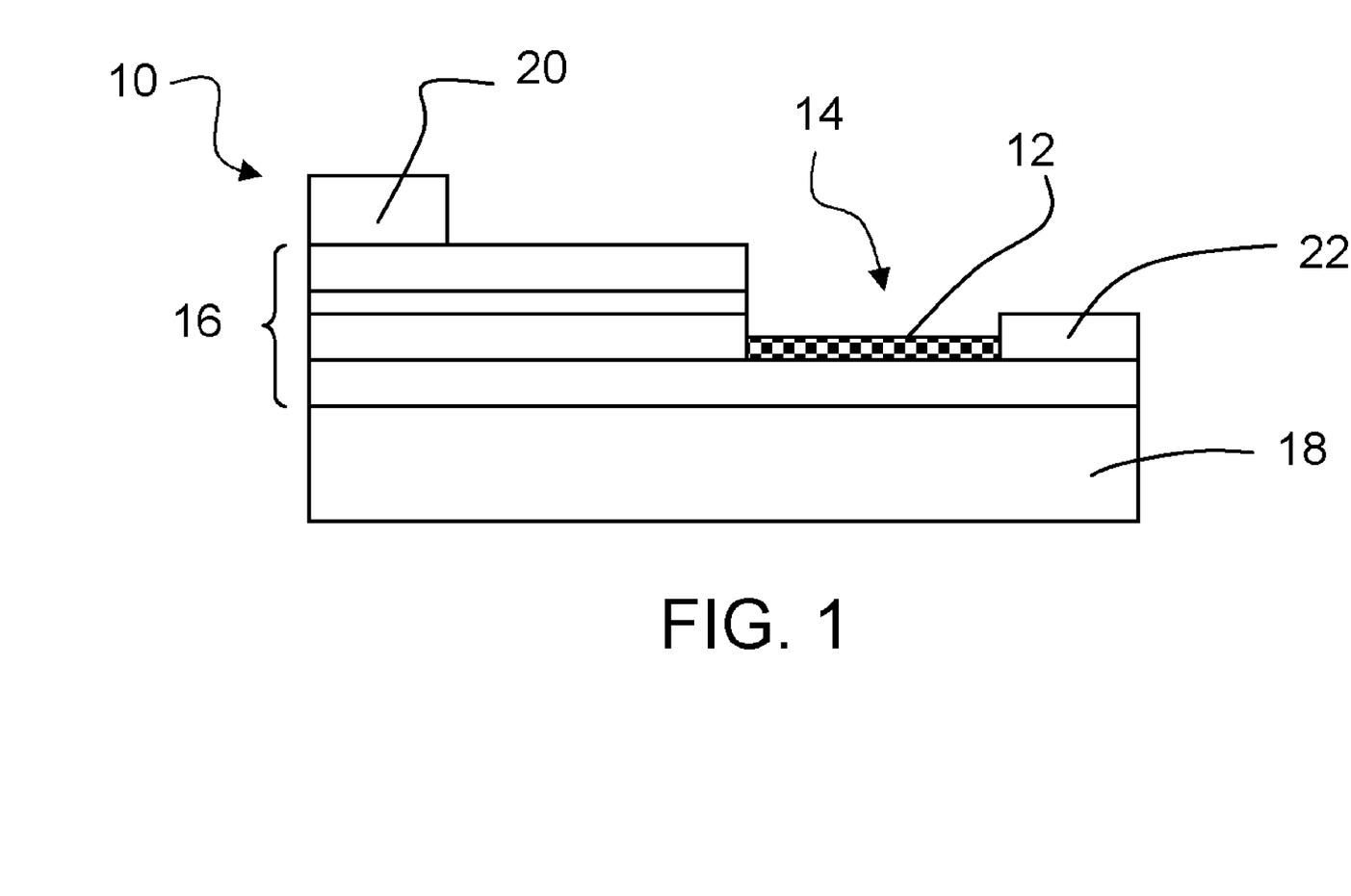
FIG. 1 is a schematic illustration of a preferred embodiment white LED of the invention that includes a GaN LED and a silicon nanoparticle-polymer wavelength conversion film.

FIG. 1 shows an example white LED device of the invention, which has a GaN LED 10 with a luminescent silicon nanoparticle composite conversion film 12. An example experimental prototype consistent with FIG. 1 was constructed starting with a GaN LED. A colloid of silicon nanoparticles was combined or mixed with a polymer or organosilicon adhesive. An active region 14 of the GaN LED is covered with layer of silicon nanoparticle-polymer composite by spreading a volume on the active face. The composite is allowed to dry under ambient conditions, resulting in the formation of a thin polymer layer with embedded silicon nanoparticles. The film dries to a uniform thickness. The LED 10 has an example conventional structure, except for the conversion film 12, and other types of LEDs can also be used. In the example structure, a multiple quantum well GaN structure 16 is supported by a substrate 18 and driven by electrodes 20, 22.

Figure 2A:
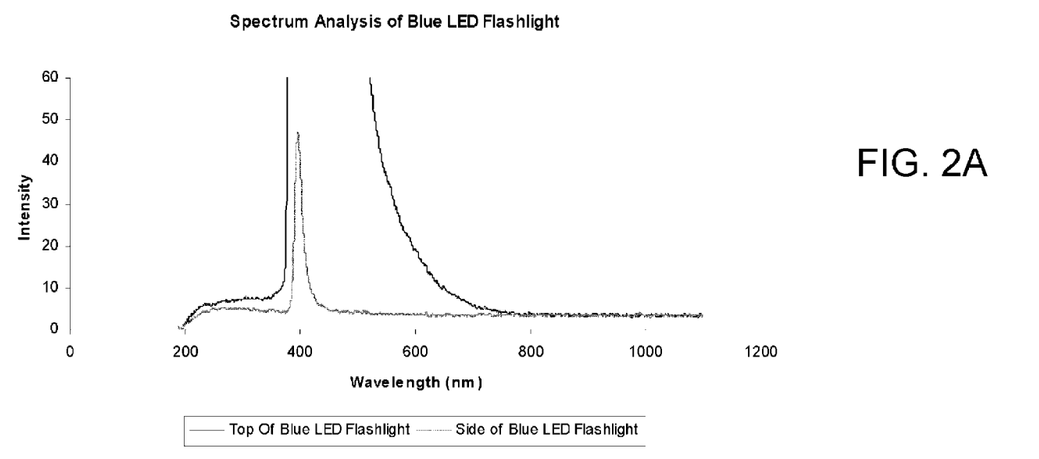
FIGS. 2A and 2B respectively show the spectral content of blue/UV LED and UV mercury lamp sources used in an experiment to excite an example white LED of the invention.
Figure 2B:
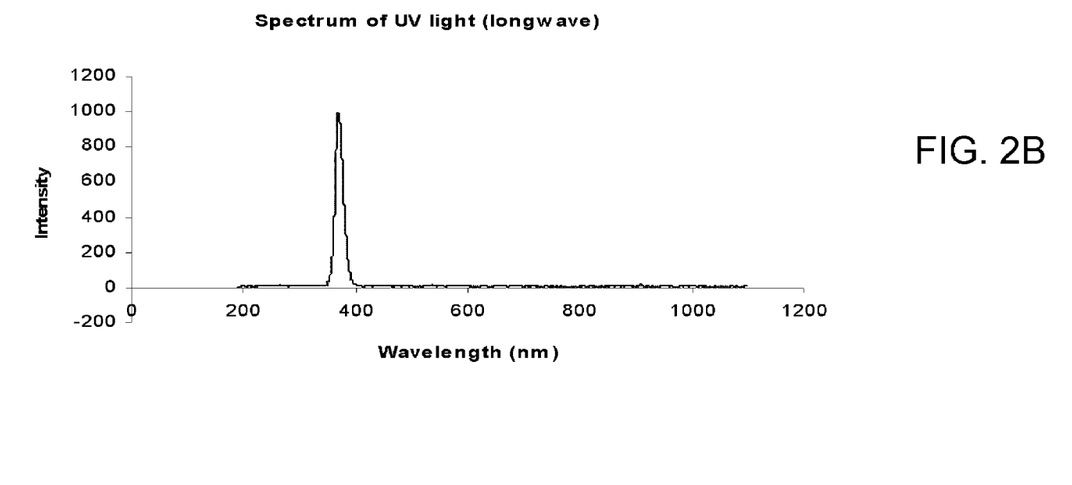

In experiments, an example polymer was a polyurethane/vinyl polymer varnish that was impregnated with red luminescent silicon nanoparticles without agglomeration to convert LED light to white light. Photoluminescence was then examined using irradiation from a mercury lamp at 365 nm, and a blue/uv LED at 397 nm. The LED source in the experiment consisted of 12 individual LEDs, configured in housing similar to a regular household flash light. FIGS. 2A and 2B show the spectrum of the LED source as well as the 365 nm mercury source taken with a holographic grating. The LED band extends from 386 to 418 with a peak at 397 nm. The mercury band extends from about 350 nm to 400 nm with a peak at 365 nm.

Figure 3A:
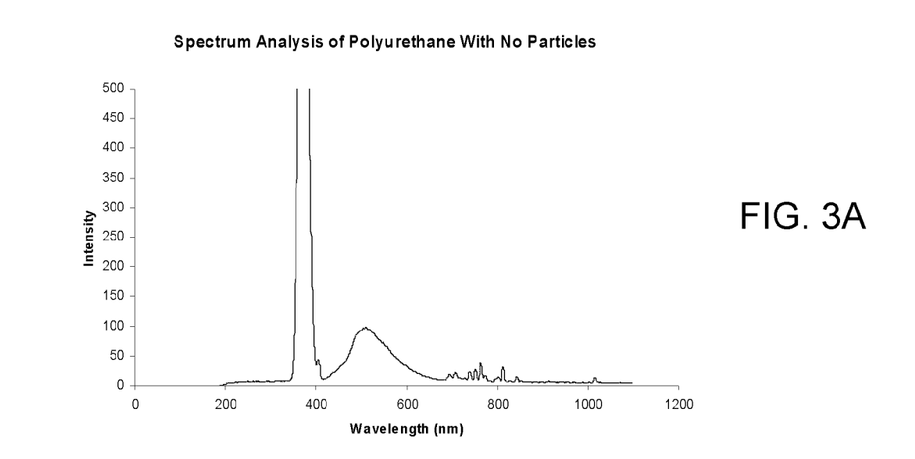
FIGS. 3A, 3B and 3C respectively show the luminescence spectra under UV 365 nm excitation of polyurethane, silicon nanoparticles in THF, and a silicon nanoparticle-polyurethane composite converter film of the invention.
Figure 3B:
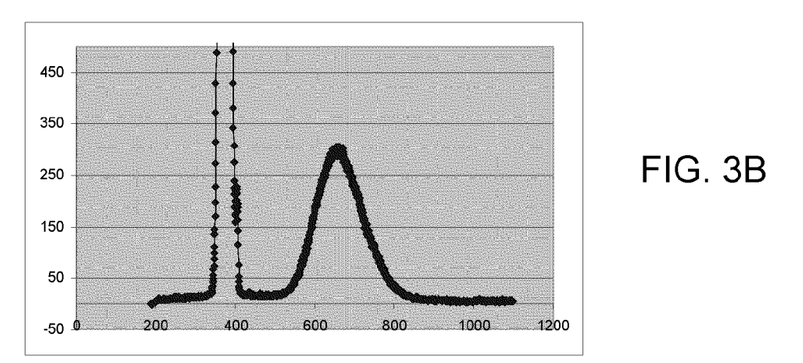
Figure 3C:
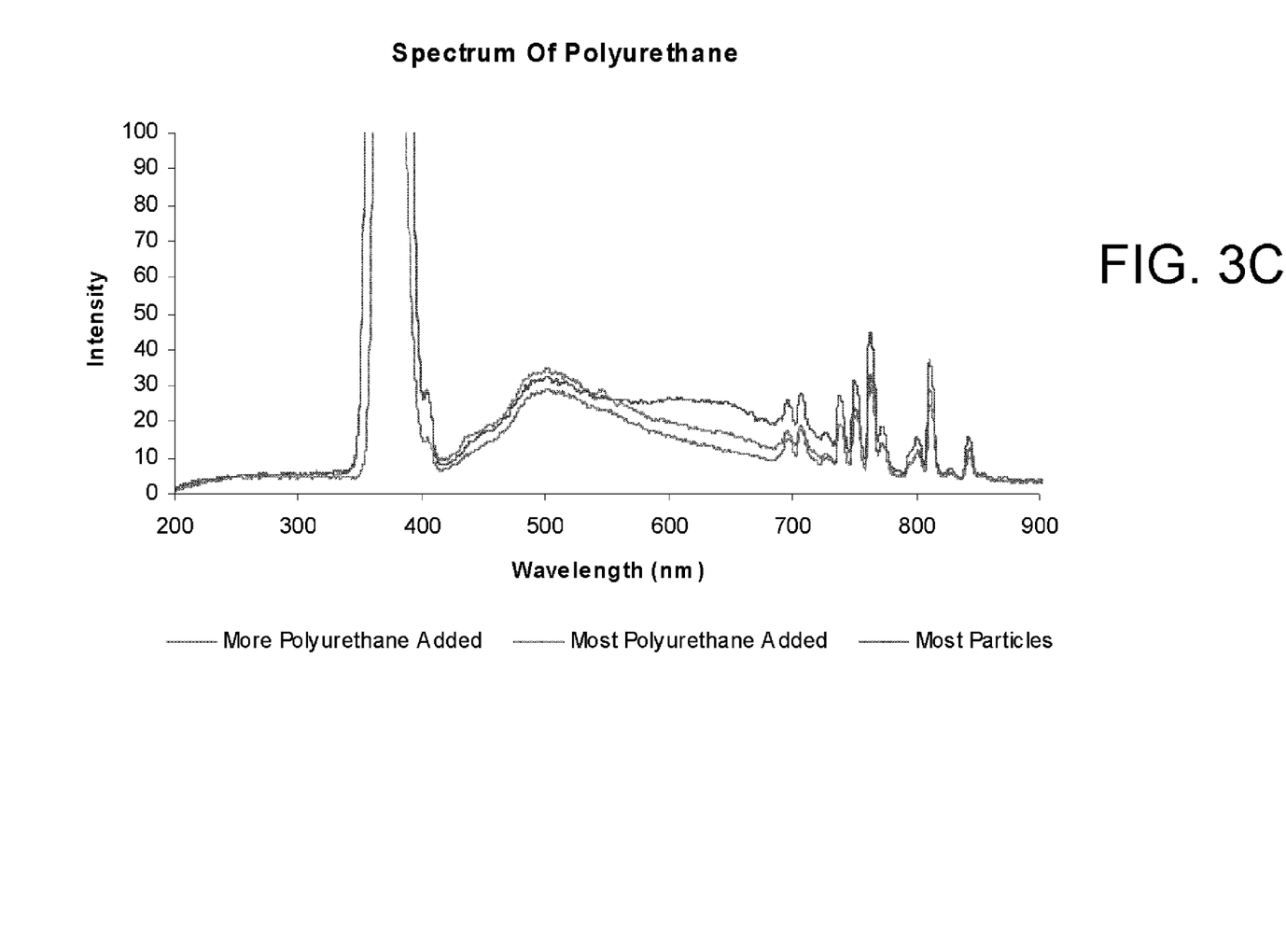

The development of the color of the mixture from blue/green, characteristic of the polyurethane, to nearly "white" was observed. Adding a higher levels of silicon nanoparticles results in a red tinge to the mixture, characteristic of that of the control particle sample. The composite got brighter (white) with time (harder drying). FIGS. 3A, 3B and 3C show the corresponding photoluminescence spectra. The pure polyurethane shows a blue/green band extending from 427 to 607 with a peak at 515 nm and a tail extending to 670 nm. The silicon nanoparticles show a red band extending from 550 nm to 800 nm with a peak at 630 nm. The particle-polyurethane spectrum shows filled spectrum covering reasonably well most of the visible spectrum. As to curing, it was found that the two samples cured nearly at the same rate.

Surprisingly, the Si—H terminated silicon nanoparticles do not aggregate when mixed with polymers or organosilicon components. A concern with mixing additional components into polymers or organosilicon components is a potential negative effect on the curing properties of the polymers or organosilicon components. Surprisingly, the Si—H terminated silicon nanoparticles do not aggregate when mixed with RTV polymer components. This was a surprising result, as the addition of particles to polymers and organosilicon compounds, such as RTV polymer components, is typically expected to inhibit the properties of the compounds and result in the aggregation of particles. The mechanism that permits this is believed to occur as follows.

The example polyurethane served as an excellent mechanism for dissolution of the silicon nanoparticles, which provided homogeneous mixing without agglomeration or aggregation. The mechanism for dissolution and mixing is explained as follows, to provide guidance as to similar polymers and organosilicon compounds that will similarly provide an efficient mechanism for dissolution of the silicon nanoparticles to form a homogenous film without significant agglomeration or aggregation. It is believed that with polyurethane, diisocyanate unit (in a compound) which includes double bonds of the form —N═C═O interacts with a di-alcohol HO—R—OH unit (in a compound) as a crosslinker. In the process, the N═C double bond is broken, and the hydrogen in the OH gets transported to the nitrogen site and O simultaneously attaches to the C site to produce C—O bond, resulting in the urethane unit (additive polymerization). In other words, the process proceeds via diamine chain extension, resulting in a polyurethane dispersion. A catalyst can also be used to speed up the reaction as well as other agents to control the acidity.

The silicon nanoparticles used to form the film have multiple Si—H termination sites. Thus, the silicon nanoparticles can be incorporated in the process by acting as a secondary linker via transporting the H from the particle to the nitrogen site and the attachment of Si atoms on the particle to the C site to produce a silicon carbide bond (Si—C). In this manner, Si particles effectively dissolve in the polyurethane uniformly and homogeneously without aggregation or agglomeration or disruption of the overall polymerization process.

In one example 4,4'-dicyclohexylmethylene diisocyanate is used, while poly(1,6-hexanediol/neopentyl glycol adipate) is used as a cross linker. It is to be noted that 1,6 Hexanediol is $HO(CH_2)_6OH$. The water-soluble tetramethylammonium hydroxide, $(CH3)4$ NOH, initiates the cross linking and speeds the polymerization. In addition, 2,2-dimethylol propionic acid, $CH_3$-$C(CH_2OH)_2$-COOH is included. The use of the adipate ($^-OOC$—$(CH_2)_4$—$COO^-$), which is the ionized form of adipic acid is intended to regulate the acidity of the mixture. The ammonium hydroxide neutralizes the polyurethane. Thus the silicon nanoparticles may be incorporated in the process by substituting for poly(1,6-hexanediol/neopentyl glycol adipate).

Preferred conversion films are formed by embedding the silicon particles in an organosilicon such as RTV (room temperature vulcanizing adhesive) or in a polyurethane polymer adhesive film. Because the particles have a high absorption coefficient of blue/UV light, and a high quantum efficiency of down conversion to visible light, the silicon nanoparticles necessary in the experiments to obtain white balance are only necessary in very low concentrations that do not affect the properties of the organosilicon or polymer adhesive into which the silicon nanoparticles are incorporated. As such they did not adversely affect the strength or texture of the cured samples.

The silicon nanoparticle-polymer film also acts as UV stabilizer for the film into which it is incorporated. This has a number of advantages. For example, outdoor applications often require that polyurethane contains ultraviolet light absorbers to protect against damage from sunlight. For pigmented applications, such as vinyl siding, window frames, and building panels, titanium (IV) oxide is usually used. For applications where the material must be transparent, various aromatic organic compounds are added. The silicon nanoparticle makes a composite and is a feasible alternate to such additives.

The silicon nanoparticles exhibit wide luminescence spectra and come in several sizes with luminescence centered in the blue, green, yellow, and red, covering the entire visible spectrum. Thus, it is possible to produce white light devices using standalone Si nanoparticles or they may be incorporated in existing devices to fill in missing portions of the visible spectrum, such as phosphorus LEDs which lack a red component. As demonstrated by the experiments, it is possible to supplement the phosphorous converter with the red particles to improve the CRI to a level that approaches that of natural sunlight (a CRI of 90-95%). In the experiments that were conducted, the polyurethane was found to be active in the blue/green region. For this reason, only red particles were necessary to fill in the spectrum and to produce white light. The mixture can be optimized to mimic closely the spectrum in sunlight by additional mixing with a small amount of particles in the other sizes.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A luminescent silicon nanoparticle polymer composite, comprising:
    a film of a polymer or an organosilicon compound; and
    within the film of the polymer or organosilicon compound, a dispersion of luminescent silicon nanoparticles;
    wherein each of the silicon nanoparticles has multiple Si—H termination sites, and wherein at least one of the Si—H sites of at least one of the silicon nanoparticles is linked to a respective C site of the polymer or organosilicon compound to produce a silicon carbide bond (Si—C).

2. The composite of claim 1, wherein the silicon nanoparticles act as a secondary cross linker during polymerization of the polymer or organosilicon compound.

3. The composite of claim 1, wherein said silicon nanoparticles are incorporated into the polymer or organosilicon compound in a quantity sufficient for wavelength conversion but small enough to have no or an insubstantial effect on curing properties of the polymer or the organosilicon compound.

4. A luminescent silicon nanoparticle polymer composite, comprising:
    a polymer or an organosilicon compound; and
    within the polymer or organosilicon compound, a dispersion of luminescent silicon nanoparticles;
    wherein each of the silicon nanoparticles has multiple Si—H termination sites, and wherein at least one of the Si—H sites of at least one of the silicon nanoparticles is linked to a respective C site of the polymer or organosilicon compound to produce a silicon carbide bond (Si—C), wherein the polymer comprises polyurethane.

5. The composite of claim 1, wherein the silicon nanoparticles comprise red nanoparticles.

6. A white LED, comprising:
    a light emitting diode having a narrow band wavelength output; and
    a luminescent silicon wavelength converter comprised of a composite film for converting the narrow band wavelength output into wide band wavelength output, the composite film comprising a polymer or an organosilicon compound, and within the polymer or organosilicon compound, a dispersion of luminescent silicon nanoparticles, wherein each of the silicon nanoparticles has multiple Si—H termination sites, and wherein at least one of the Si—H sites of at least one of the silicon nanoparticles is linked to a respective C site of the polymer or organosilicon compound to produce a silicon carbide bond (Si—C).

7. The LED of claim 6, wherein the LED comprises a GaN LED.

8. The LED of claim 7, wherein the wavelength converter film is disposed on an active region of the LED.

* * * * *

UNITED STATES PATENT AND TRADEMARK OFFICE
CERTIFICATE OF CORRECTION

PATENT NO. : 8,076,410 B2  
APPLICATION NO. : 12/241870  
DATED : December 13, 2011  
INVENTOR(S) : Nayfeh et al.

Page 1 of 1

It is certified that error appears in the above-identified patent and that said Letters Patent is hereby corrected as shown below:

On the Title Page:

In "(73) Assignee":

Line 1    Please delete "Nanosi" and insert --NanoSi-- therefor.

In the Specification:

Col. 1, line 54    After "lifespan", please delete "significantly".

Col. 3, line 58    After "and", please delete "-n" and insert --an-- therefor.

Col. 4, line 49    After "same", please delete the "," and insert a --.-- therefor.

Col. 5, line 31    Before "layer", please insert --a--.

Col. 5, line 56    After "Adding", please delete "a".

Col. 6, line 24    Please delete "—N═C═O" and insert -- -N=C=O-- therefor.

Signed and Sealed this  
Fifth Day of June, 2012

David J. Kappos  
*Director of the United States Patent and Trademark Office*